United States Patent
Stone et al.

(10) Patent No.: US 8,531,814 B2
(45) Date of Patent: Sep. 10, 2013

(54) REMOVAL OF CHARGE BETWEEN A SUBSTRATE AND AN ELECTROSTATIC CLAMP

(75) Inventors: Dale K. Stone, Lynnfield, MA (US); Lyudmila Stone, Lynnfield, MA (US); Klaus Petry, Merrimac, MA (US); David E. Suuronen, Newburyport, MA (US); Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 361 days.

(21) Appl. No.: 12/759,990

(22) Filed: Apr. 14, 2010

(65) Prior Publication Data

US 2010/0265631 A1    Oct. 21, 2010

Related U.S. Application Data

(60) Provisional application No. 61/169,950, filed on Apr. 16, 2009.

(51) Int. Cl.
*H01L 21/683* (2006.01)
*H01T 23/00* (2006.01)
*H01H 47/00* (2006.01)
*H05F 3/00* (2006.01)
*H05F 3/02* (2006.01)

(52) U.S. Cl.
USPC ............................ 361/234; 361/220

(58) Field of Classification Search
USPC .................................... 361/234, 220
See application file for complete search history.

(56) References Cited

U.S. PATENT DOCUMENTS

| 6,081,414 A * | 6/2000 | Flanigan et al. | 361/234 |
| 6,388,861 B1 * | 5/2002 | Frutiger | 361/234 |
| 6,620,736 B2 * | 9/2003 | Drewery | 438/710 |
| 6,643,048 B2 * | 11/2003 | Gopalakrishnan et al. | 359/254 |
| 7,336,471 B2 * | 2/2008 | Suehira et al. | 361/220 |
| 2007/0066062 A1 * | 3/2007 | Liu et al. | 438/689 |
| 2011/0026187 A1 | 2/2011 | Reynolds | |

FOREIGN PATENT DOCUMENTS

| JP | 05183043 A | 7/1993 |
| JP | 2001210706 A | 8/2001 |
| JP | 2006060212 A | 3/2006 |

* cited by examiner

*Primary Examiner* — Jared Fureman
*Assistant Examiner* — Lucy Thomas (57) ABSTRACT

An electrostatic clamp, which more effectively removes built up charge from a substrate prior to and during removal, is disclosed. Currently, the lift pins and ground pins are the only mechanisms used to remove charge from the substrate after implantation. The present discloses describes a clamp having one of more additional low resistance paths to ground. These additional conduits allow built up charge to be dissipated prior to and during the removal of the substrate from the clamp. By providing sufficient charge drainage from the backside surface of the substrate 114, the problem whereby the substrate sticks to the clamp can be reduced. This results in a corresponding reduction in substrate breakage.

8 Claims, 7 Drawing Sheets

REMOVAL OF CHARGE BETWEEN A SUBSTRATE AND AN ELECTROSTATIC CLAMP

This application claims priority of U.S. Provisional Patent Application Ser. No. 61/169,950, filed Apr. 16, 2009, the disclosure of which is hereby incorporated by reference.

FIELD

This disclosure relates to a substrate handling, and more particularly to an apparatus and a method of handling a substrate.

BACKGROUND

An electronic device may be created from a substrate that has undergone various processes. One of these processes may include introducing impurities or dopants to alter the electrical properties of the original substrate. For example, charged ions, as impurities or dopants, may be introduced to a substrate, such as a silicon wafer, to alter electrical properties of the substrate. One of the processes that introduces impurities to the substrate may be an ion implantation process.

Figure 1:
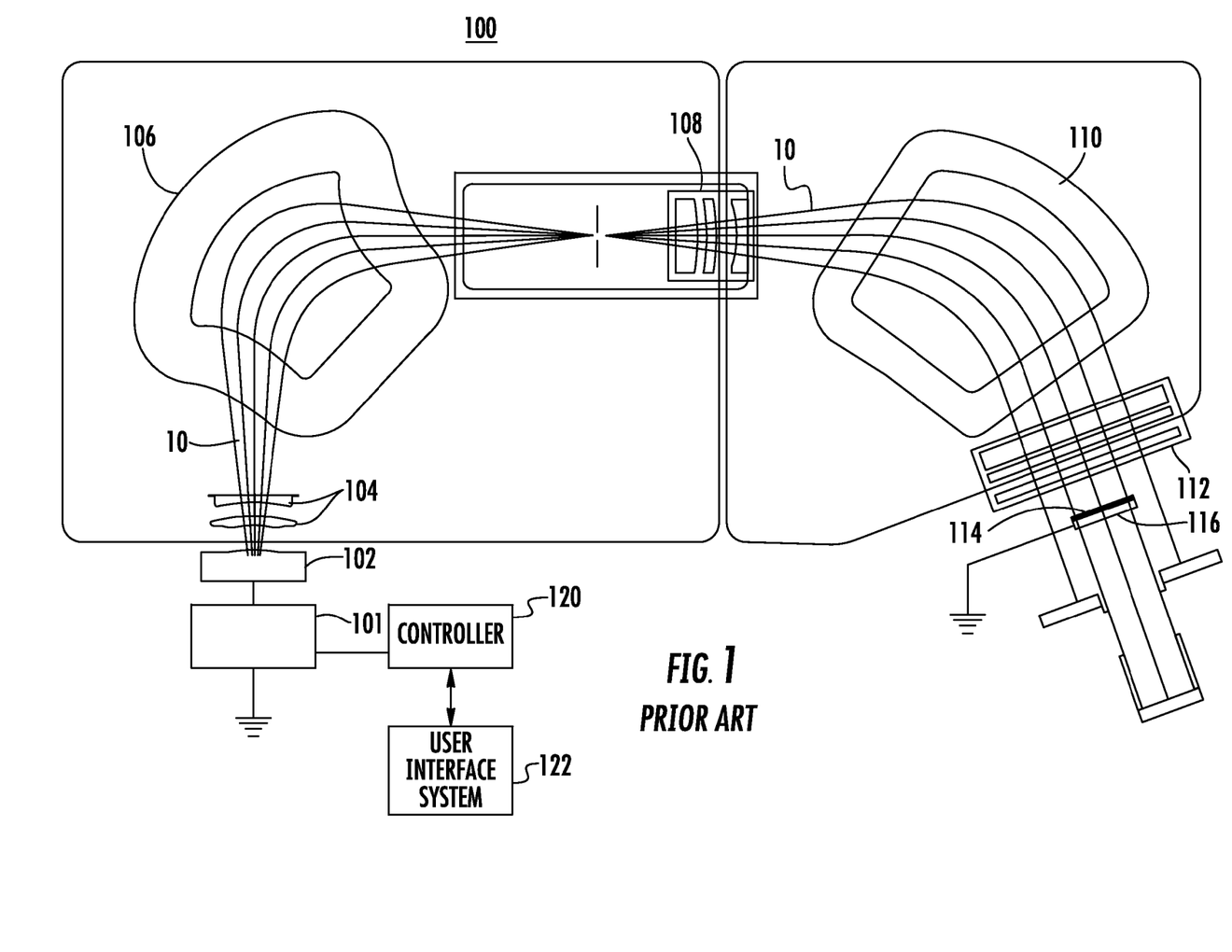
FIG. 1 represents a traditional ion implantation system.

An ion implanter is used to perform ion implantation or other modification of a substrate. A block diagram of a conventional ion implanter is shown in FIG. 1. The conventional ion implanter may comprise an ion source 102 that may be biased by a power supply 101. The system may be controller by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a substrate or wafer 114, which is disposed on a substrate support 116.

In operation, a substrate handling robot (not shown) disposes the substrate 114 on the substrate support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the substrate 114. After implanting ions is completed, the substrate handling robot may remove the substrate 114 from the substrate support 116 and from the ion implanter 100.

Figure 2A:
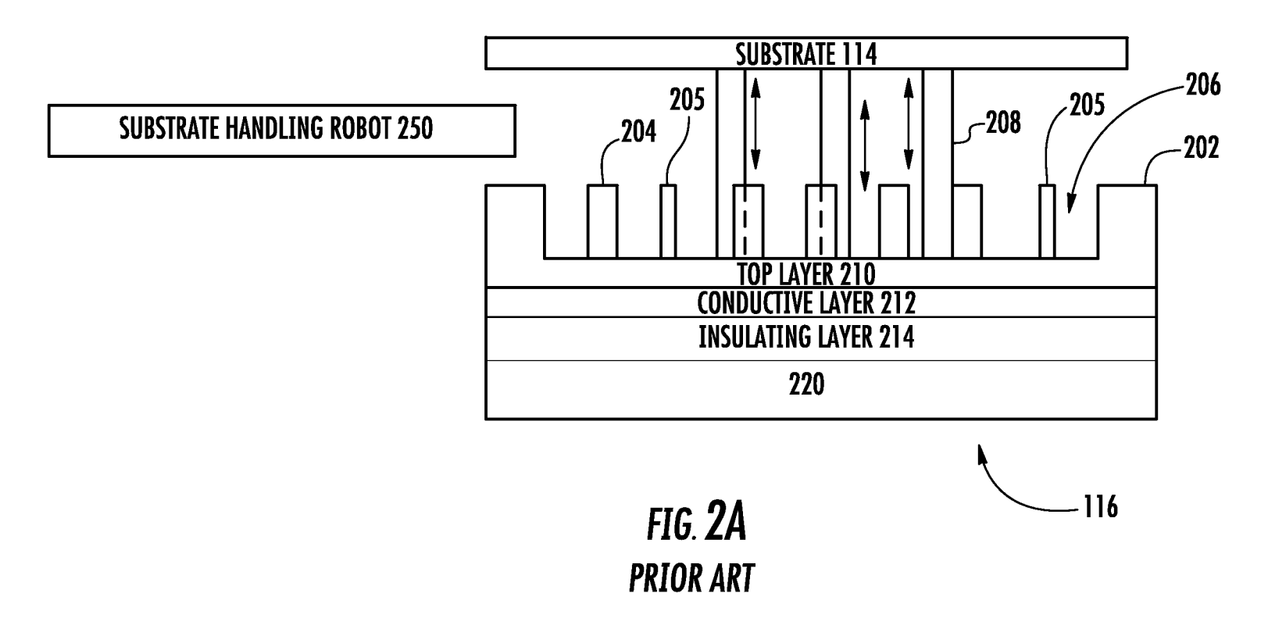
FIG. 2A represents a block diagram showing a workpiece support supporting a substrate with the lift pins extended.
Figure 2B:
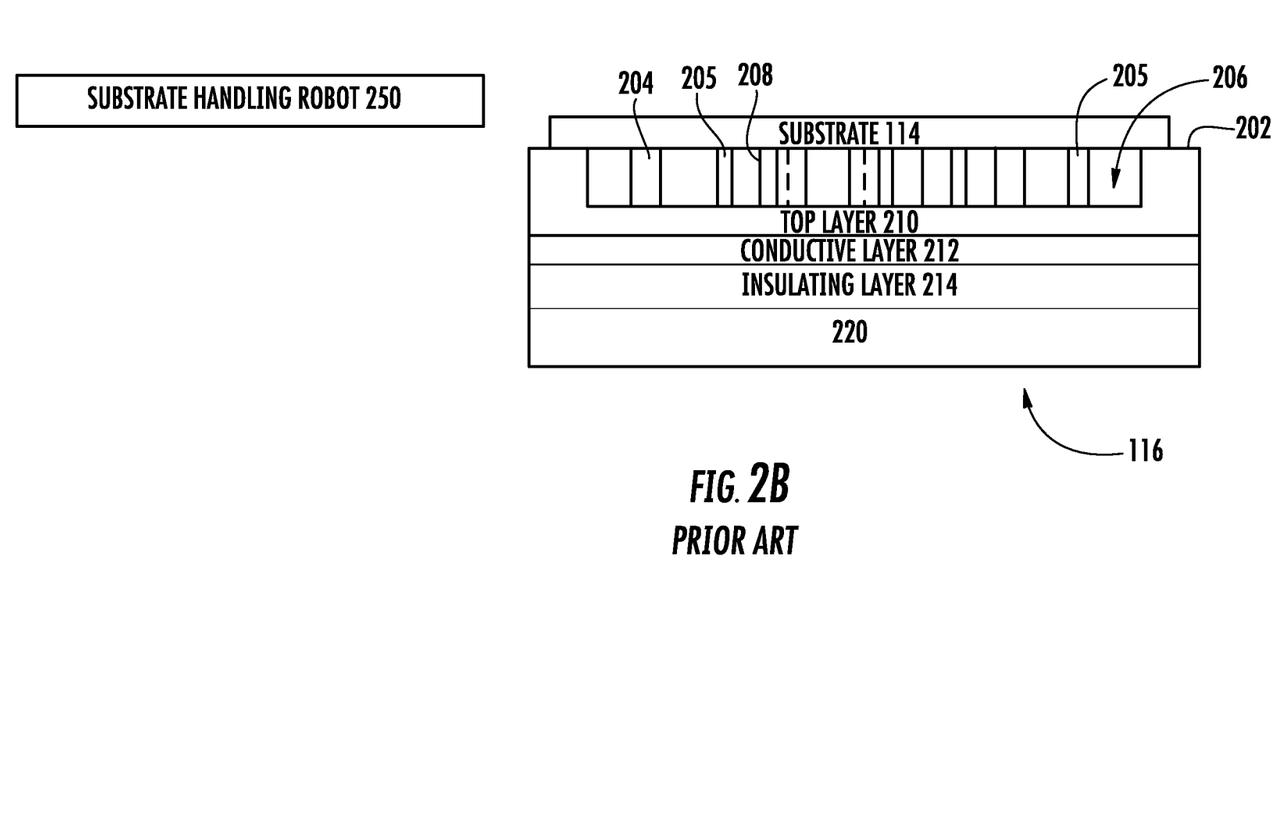
FIG. 2B represents a block diagram showing a workpiece support supporting a substrate with the lift pins recessed.

Referring to FIGS. 2A and 2B, there is shown a block diagram illustrating the workpiece support 116 supporting the substrate 114 during the ion implantation process. As illustrated in FIG. 2A, the workpiece support 116 may comprise a sealing ring 202 and a plurality of embossments 204 that are in contact with the substrate 114. The sealing ring may be an annular ring of about 0.25 inches in width, and having a height of 5 microns. The embossments 204 may be about 1 mil in diameter and 5 microns high. In addition, the workpiece support 116 may also include at least one cooling region 206. During the implantation process, cooling gas may be provided to the cooling region 206 prevent the substrate 114 from overheating. The workpiece support 116 may have gas channels and conduits to allow this cooling gas to flow to the cooling region 206. The workpiece support 116 may further include a plurality of lift pins 208 that may move so as to push the substrate 114 away from the workpiece support 116 in the direction indicated by the arrows. The lift pins 208 may be retracted within the workpiece support 116, as illustrated in FIG. 2B. The workpiece would also be normally in contact with a plurality of ground pins 205.

The workpiece support 116 may be cylindrical in shape, such that its top surface is circular, so as to hold a disc-shaped substrate. Of course, other shapes are possible. To effectively hold the substrate 114 in place, most workpiece supports typically use electrostatic force. By creating a strong electrostatic force on the upper side of the workpiece support 116, the support can serve as the electrostatic clamp or chuck, the substrate 114 can be held in place without any mechanical fastening devices. This minimizes contamination, avoids wafer damage from mechanical clamping and also improves cycle time, since the substrate does not need to be unfastened after it has been implanted. These clamps typically use one of two types of force to hold the substrate in place: coulombic or Johnson-Rahbeck force.

As seen in FIG. 2A, the clamp 116 traditionally consists of several layers. The first, or top, layer 210, which contacts the substrate 114, is made of an electrically insulating or semi-conducting material, such as alumina, since it must produce the electrostatic field without creating a short circuit. In some embodiments, this layer is about 4 mils thick. For those embodiments using coulombic force, the resistivity of the top layer 210, which is typically formed using crystalline and amorphous dielectric materials, is typically greater than $10^{14}$ $\Omega$-cm. For those embodiments utilizing Johnsen-Rahbeck force, the volume resistivity of the top layer, which is formed from a semiconducting material, is typically in the range of $10^{10}$ to $10^{12}$ $\Omega$-cm. The term "non-conductive" is used to describe materials in either of these ranges, and suitable for creating either type of force. The coulombic force can be generated by an alternating voltage (AC) or by a constant voltage (DC) supply.

Directly below this layer is a conductive layer 212, which contains the electrodes that create the electrostatic field. This conductive layer 212 is made using electrically conductive materials, such as silver. Patterns are created in this layer, much like are done in a printed circuit board to create the desired electrode shapes and sizes. Below this conductive layer 212 is a second insulating layer 214, which is used to separate the conductive layer 212 from the lower portion 220.

The lower portion 220 is preferably made from metal or metal alloy with high thermal conductivity to maintain the overall temperature of the workpiece support 116 within an acceptable range. In many applications, aluminum is used for this lower portion 220.

Initially, the lift pins 208 are in a lowered position. The substrate handling robot 250 then moves a substrate 114 to a position above the workpiece support 116. The lift pins 208 may then be actuated to an elevated position (as shown in FIG. 2A) and may receive the substrate 114 from the substrate handling robot 250. Thereafter, the substrate handling robot 250 moves away from the workpiece support 116 and the lift pins 208 may recede into the workpiece support 116 such that the sealing ring 202 and the embossments 204 of the workpiece support 116 may be in contact with the substrate 114, as shown in FIG. 2B. The ground pins 205 are also normally in contact with the substrate 114. The implantation process may then be performed with the lift pins 208 in this recessed position. After the implantation process, the substrate 114 is unclamped from the workpiece support 116, having been held in place by electrostatic force. The lift pins 208 may then be extended into the elevated position, thereby elevating the substrate 114 and separating the substrate 114 from the edge 202 and the embossments 204 of the workpiece support 116, as shown in FIG. 2A. The lift pins 208 are either insulating or conductive and therefore may not remove any remaining charge from the substrate 114. The substrate handling robot 250 may then be disposed under the substrate 114, where it can retrieve the implanted substrate 114 at the elevated position. The lift pins 208 may then be lowered, and the robot 250 may then be actuated so as to remove the substrate 114 from the implanter.

A condition that can occur with a conventional ion implanter 100 may be found in the process of removing the substrate 114 from the workpiece support 116. After multiple cycles of clamping and unclamping a substrate 114 to a workpiece support 116, the side of the substrate 114 clamped to the workpiece support 116 may exhibit damage. This damage may be due to electrical discharge caused by electrostatic charge buildup on the substrate 114 and the top layer 210 of the workpiece support 116. The electrostatic charge may discharge (arc) to a ground pin 205 or directly to the surface of the workpiece support 116.

Previously, substrates 114 have been grounded via contact with metal lift pins 208 or ground pins 205. Substrates 114 also have been grounded previously using a plasma flood gun (PFG). Due to the brief contact time and small contact area between the lift pins 208 or ground pins 205 and the substrate 114 area containing the electrostatic charge, a condition can exist wherein the lift pins 208 and ground pins 205 do not effectively drain the electrostatic charge from the substrate 114. Accordingly, there is a need in the art for an improved electrostatic clamp that can remove charge.

SUMMARY

The problems of the prior art are overcome by the apparatus and method of this disclosure. An electrostatic clamp which more effectively removes built up charge from a substrate prior to removal is disclosed. Currently, the lift pins and the ground pins are the only mechanism used to remove charge from the substrate after implantation. The present discloses describes a clamp having one of more additional low resistance conduits to ground. These additional conduits allow built up charge to be dissipated during the removal of the substrate from the clamp. By providing sufficient charge drainage from the backside surface of the substrate, the problem whereby the substrate sticks to the clamp can be reduced. This results in a corresponding reduction in substrate breakage. In some embodiments, these ground paths are intermittent, so as not to be present when the electrostatic forces are being generated.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

In the present disclosure, several embodiments of an apparatus and a method for handling a processed substrate are introduced. For purpose of clarity and simplicity, the present disclosure will focus on an apparatus and a method for handling a substrate that is processed by a beam-line ion implanter. Those skilled in the art, however, may recognize that the present disclosure is equally applicable to other types of processing systems including, for example, a plasma immersion ion implantation ("PIII") system, a plasma doping ("PLAD") system, an etching system, an optical based processing system, and a chemical vapor deposition (CVD) system. As such, the present disclosure is not to be limited in scope by the specific embodiments described herein.

The embodiments disclosed herein provide a more reliable and lower resistance path to ground for a substrate and the top layer of an electrostatic clamp. Some portion of the substrate will be contacted to ground regardless of how or in what direction the substrate is released from the electrostatic clamp. By providing sufficient charge drainage from the backside surface of the substrate, substrate "sticking" to the electrostatic clamp and substrate breakage can be reduced.

Figure 3:
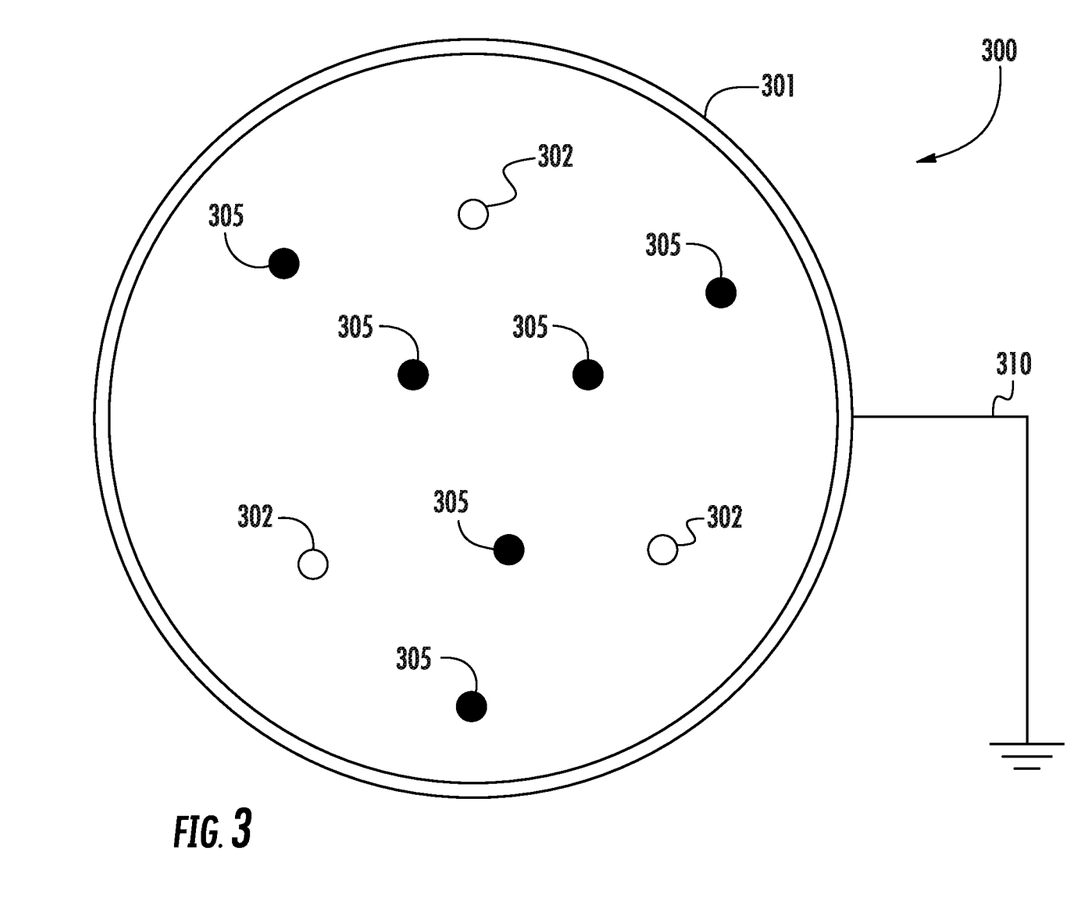
FIG. 3 represents a top view of an embodiment of an electrostatic clamp.
Figure 4:
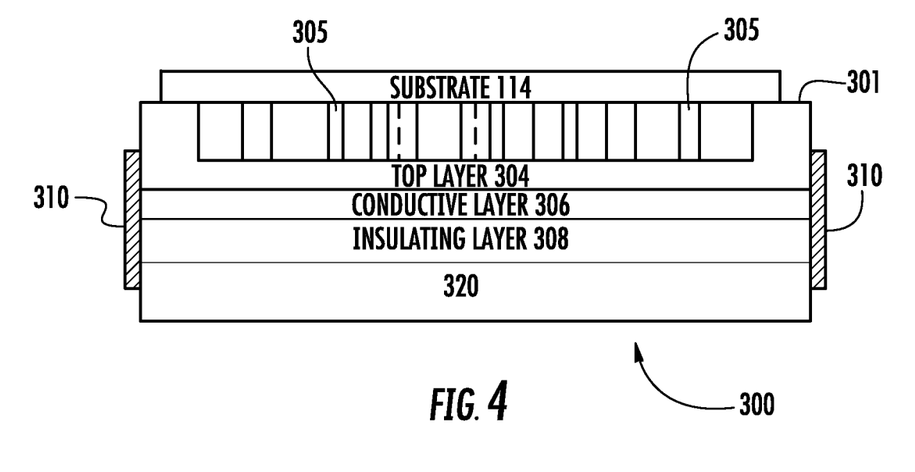
FIG. 4 represents a cross-sectional view of the embodiment of FIG. 3.

FIG. 3 is a top perspective view of an embodiment of an electrostatic clamp (or "clamp") 300. The electrostatic clamp 300 is one example of a workpiece support. The clamp 300 has an outer annulus or sealing ring 301. In one instance, the ring 301 may be approximately 0.25 inches in width. Although not shown, the upper surface of the clamp 300 may also have embossments. Lift pins 302 are used to lift the substrate from the clamp 300 after processing of the substrate has been completed. As seen in FIG. 4, the sealing ring 301 is connected to ground. Since the sealing ring 301 is made of high resistivity material, there may need to be a plurality of connections 310, spatially separated around the sealing ring 301. This connection 310, which can be sealed, may be very low resistance, such as through a conductive material, such as copper. In other embodiments, the connection 310 to ground may be through a semiconducting material, such as carbon film. In some embodiments, the resistivity of the material used to connect the sealing ring 301 to ground may be about $10^7$ Ω-cm.

FIG. 4 shows a cross-section view of the clamp 300 of FIG. 3. As described above, the lower portion 320 of the electrostatic clamp 300 is typically made of a metal, and is also connected to ground. Therefore, in some embodiments, the sealing ring 301 is connected to ground by connecting the sealing ring 301 to the lower portion 320 of the clamp 300. This connection 310 can be made by applying a conductive or semiconductive coating around the entire circumference of the sealing ring 301, so that the sealing ring 301 is in continuous contact with the lower portion 320. In other embodiments, the connection 310 between the ring 301 and the lower portion 302 is not around the entire circumference. Rather, a number of discrete connections 310 are made between the lower portion 320 and the sealing ring 301. In some embodiments, a carbon film is applied around the circumference of the sealing ring 301, connecting it to the lower portion 320.

Other materials, such as Aguadag® paint, which is a water-based colloidal graphite suspension, or other carbon-based materials may also be used.

While FIG. 4 shows the sealing ring 301 connected to the lower portion 320 of the electrostatic clamp 300 via connection 310, other ground connections are possible and within the scope of the disclosure. FIG. 4 describes just one possible embodiment. For example, the sealing ring 301 may be connected to a ground other than through the lower portion 320 of the electrostatic clamp 300.

As described above, the top layer 304 of the electrostatic clamp 300 is constructed using non-conductive materials, where the resistivity of the material can be in the range between $10^8$ Ω-cm and $10^{15}$ Ω-cm. At a resistivity near the lower end of this range, the connection 310 of the sealing ring 301 to ground may be sufficient to eliminate the built up charge on the top layer 304 of the electrostatic clamp 300 and the substrate 114. In other words, the resistivity of the top layer 304 is sufficiently low to allow the charge built up on the top layer 304 and the substrate 114 to flow to the sealing ring 301, which is connected to ground.

Furthermore, tests have shown that the grounding of the sealing ring 301 (i.e. passive connection to ground) has minimal impact on the clamping force of the electrostatic clamp 300. This is due to the generally high resistivity of the top surface 304, which limits the effect of the grounded sealing ring 301. However, in some embodiments, the sealing ring 301 may be intermittently connected to ground (i.e. active ground connection). For example, using a switch or other device, the ground connection 310 may be interrupted while the electrodes 306 are actively generating an electrostatic field. In other words, the switch is in series between the sealing ring 301 and ground, such that actuation of the switch either enables or disables the connection to ground. When the electrodes 306 are inactive, the grounding connection 310 may be restored. This modification insures that the grounding of the top surface 304 of the clamp 300 has minimal or no impact on the electrostatic clamp force.

In other embodiments, the resistivity of the top layer 304 may be great, such as more than $10^{12}$ Ω-cm. In such embodiments, the grounding of the sealing ring 301 may be insufficient to drain the built up charge on the substrate 114 and the top layer 304. In other words, the resistivity of the top layer 304 is too high to allow the built up charge to freely flow to the sealing ring 301. In such an embodiment, conductive, or semiconductive conduits may be deposited on (or in) the top layer 304. These conduits are intended to allow built up charge to flow more readily to the sealing ring 301.

Figure 5:
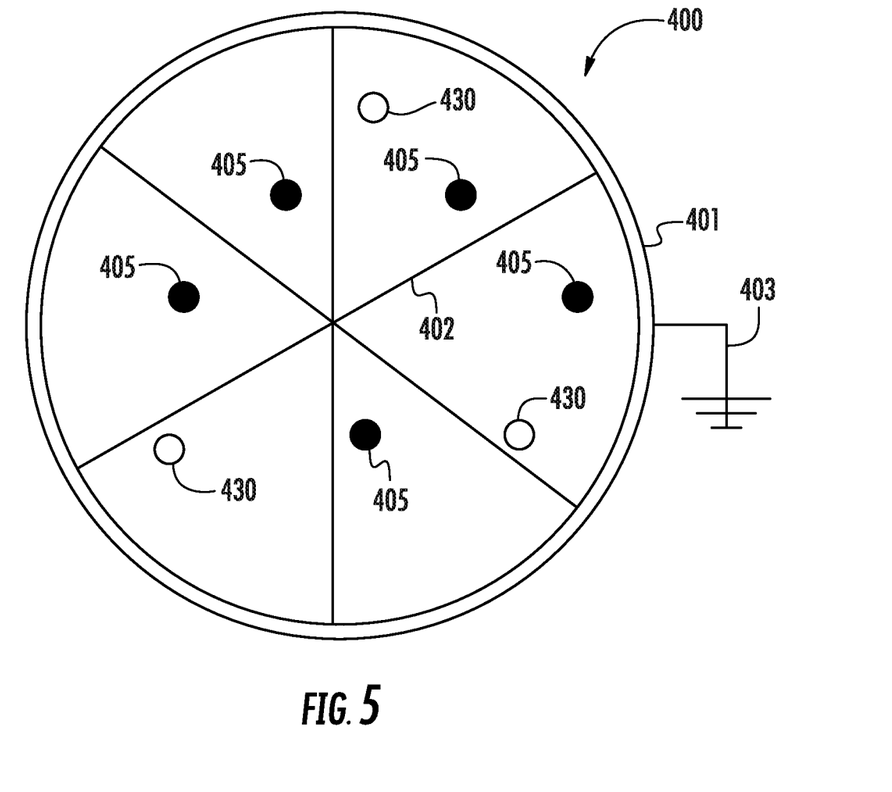
FIG. 5 represents a top view of a second embodiment of an electrostatic clamp.

FIG. 5 shows a top perspective view of a second embodiment of an electrostatic clamp (or "clamp") 400. In some embodiments, the clamp 400 may have a cross section similar to that shown in FIG. 4 where there is a non-conductive top layer, an electrically conductive layer, an insulating layer and a lower portion. As described above, the electrostatic clamp 400 has an outer annulus or sealing ring 401, which may be approximately 0.25 inches in width. In one embodiment, the sealing ring 401 may correspond to the sealing ring 301 in FIG. 3. As before, the sealing ring 401 is connected to ground using a ground connection 403. The electrostatic clamp 400 also includes lift pins 430 and ground pins 405. The electrostatic clamp 400 also includes a number of conduits 402 from various locations on the top surface of the electrostatic clamp 400 to the sealing ring 401. While six conduits 402 are illustrated in FIG. 5, more or fewer conduits 402 may be used and this embodiment is not solely limited to six conduits 402. Furthermore, different patterns of conduits 402 than that illustrated in FIG. 5 are possible. The conduits 402 allow charge to flow to the sealing ring 401.

Furthermore, the conduits 402 in FIG. 5 are shown as radial spokes. However, other conduit 402 patterns are possible. The conduits 402 may be arranged to allow a path of lower resistance (than currently exists) between points on the top surface of the electrostatic clamp 400 and ground.

The conduits 402 may be fabricated of, for example, carbon or SiC. The conduits 402 also may be fabricated of some other conductive deposited material known to those skilled in the art. In some embodiments, the conduits 402 are applied to the top surface of the electrostatic clamp 400 using chemical vapor deposition (CVD). These conduits 402 are intended to reduce the resistance to ground. However, these conduits 402 may still exhibit some resistivity. For example, in some embodiments, the conduits 402 have a resistivity of between $10^4$ and $10^8$ Ω-cm.

Figure 6:
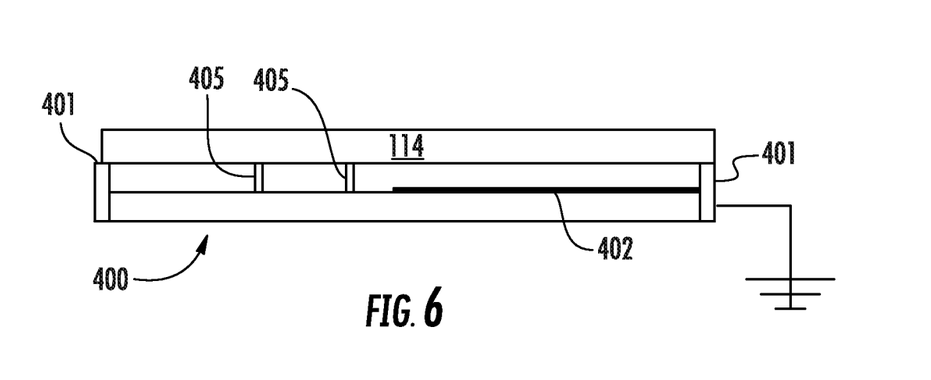
FIG. 6 represents a cross-sectional view of the embodiment of FIG. 5.

FIG. 6 is a cross-sectional view of an embodiment of an electrostatic clamp 400. The substrate 114 is disposed on the electrostatic clamp 400. In this position, ground pins 405 may normally be in contact with the substrate 114. If the substrate 114 is not in direct contact with the sealing ring 401, the conduit 402 (represented by the shaded portion in FIG. 6) can carry charge from the substrate 114 to the sealing ring 401. If the substrate 114 is in contact with the ring 401 and conduits 402, charge flow may increase. While a single conduit 402 is illustrated in FIG. 6, other numbers of conduits 402 may be present. Furthermore, while the conduit 402 is illustrated as protruding from the top surface of the clamp 400 in FIG. 6, the conduit 402 may be recessed in the top surface of the clamp 400.

Figure 7:
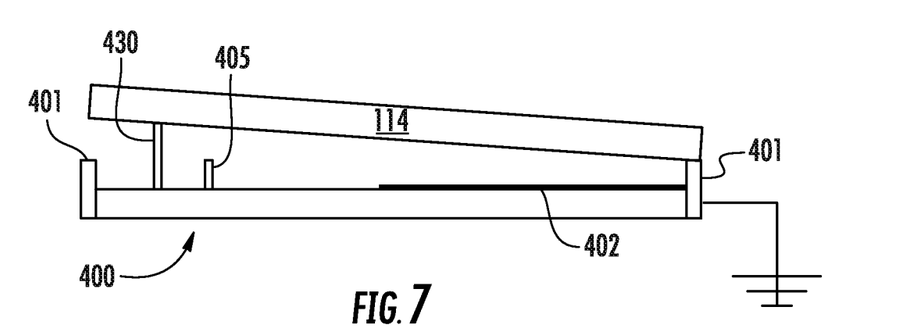
FIG. 7 represents a cross-sectional view of the embodiment of FIG. 6 where the substrate sticks to the clamp.

FIG. 7 is a cross-sectional view of the embodiment of FIG. 6 with the substrate sticking to the sealing ring. The substrate 114 is being lifted using lift pin 430. As the lift pins 430 elevate, the connection between the ground pins 405 and the substrate 114 is broken. Because of the connection to the grounded sealing ring 401, electrical discharge may not occur. The conduits 402 remove charge from the top surface, thereby minimizing the amount of charge that can accumulate on the substrate prior to unclamping.

If the substrate 114 sticks to the clamp 400 due to electrostatic charge, the charge can pass to ground using the conduit 402. Using, for example, the pattern of conduits 402 illustrated in FIG. 5, regardless of where the substrate 114 sticks to the clamp 400, the charge can pass to ground. This will prevent sticking and damage to the substrate 114.

The presence of lower resistance conduits on the top of the electrostatic clamp 400 may reduce the electrostatic force that holds the substrate 114 to the electrostatic clamp 400. As described above, in some instances, it may be advantageous to have the ground connection for the conduits 402 interrupted through the use of a switch while the electrostatic force is being generated. This can be done by interrupting the connection 403 between the sealing ring 401 and ground. In other embodiments, the switch is located between the conduits 402 and the sealing ring 401 such that the connection between the conduits 402 and the sealing ring 401 may be interrupted when the electrostatic force is being generated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A clamp for handling a substrate, comprising:
a top layer, made of non-conductive material, adapted to contact said substrate;
an outer annular ring surrounding said top layer that is made of said non-conductive material; and
a connection between said outer annular ring and ground, wherein said connection comprises a carbon film that is semiconducting thereby providing charge drainage for a substrate disposed on said outer annular ring.

2. The clamp of claim 1, further comprising a lower portion disposed beneath said top layer, wherein said lower portion comprises metal and is grounded, and said connection is between said outer annular ring and said lower portion.

3. The clamp of claim 1, further comprising electrodes located beneath said top layer, whereby said electrodes are configured to create an electrostatic force to hold said substrate.

4. The clamp of claim 3, wherein said connection is interrupted during the time in which said electrostatic force is being created.

5. The clamp of claim 1, further comprising conduits deposited on said top layer, wherein said conduits have a lower resistivity than said top layer.

6. The clamp of claim 5, wherein said conduits are connected to said outer annular ring.

7. The clamp of claim 1, further comprising a second connection between said outer annular ring and ground, wherein said second connection comprises said carbon film.

8. The clamp of claim 1, wherein said connection is disposed around an entire circumference of said outer annular ring.

* * * * *